United States Patent
Mani

(10) Patent No.: US 8,879,314 B2
(45) Date of Patent: Nov. 4, 2014

(54) MEMORY CELL WITH SCHOTTKY DIODE

(75) Inventor: Krishnakumar Mani, San Jose, CA (US)

(73) Assignee: III Holdings 1, LLC, Wilmington, DE (US)

(*) Notice: Subject to any disclaimer, the term of this patent is extended or adjusted under 35 U.S.C. 154(b) by 223 days.

(21) Appl. No.: 13/153,473

(22) Filed: Jun. 6, 2011

(65) Prior Publication Data
US 2014/0301138 A1 Oct. 9, 2014

(51) Int. Cl.
*G11C 11/14* (2006.01)

(52) U.S. Cl.
USPC .............. 365/171; 365/175; 365/158; 257/40

(58) Field of Classification Search
USPC ................................ 365/171, 175, 158; 257/40
See application file for complete search history.

(56) References Cited

U.S. PATENT DOCUMENTS

| | | | |
|---|---|---|---|
| 6,750,540 B2 * | 6/2004 | Kim | 257/741 |
| 7,826,258 B2 * | 11/2010 | Zhu et al. | 365/171 |
| 8,027,215 B2 * | 9/2011 | Lambertson et al. | 365/218 |
| 8,158,964 B2 * | 4/2012 | Kim et al. | 257/2 |
| 2005/0146955 A1 * | 7/2005 | Kajiyama | 365/202 |
| 2010/0157710 A1 * | 6/2010 | Lambertson et al. | 365/218 |
| 2011/0006276 A1 * | 1/2011 | Kim et al. | 257/2 |

* cited by examiner

*Primary Examiner* — Toan Le
(74) *Attorney, Agent, or Firm* — McAndrews, Held & Malloy, Ltd.

(57) ABSTRACT

Memory cell comprising two conductors, with a serially connected magnetic storage element and a Schottky diode between the two conductors. The Schottky diode provides a unidirectional conductive path between the two conductors and through the element. The Schottky diode is formed between a metal layer in one of the two conductors and a processed junction layer. Methods for process and for operation of the memory cell are also disclosed. The memory cell using the Schottky diode can be designed for high speed operation and with high density of integration. Advantageously, the junction layer can also be used as a hard mask for defining the individual magnetic storage element in the memory cell. The memory cell is particularly useful for magnetic random access memory (MRAM) circuits.

20 Claims, 4 Drawing Sheets

MEMORY CELL WITH SCHOTTKY DIODE

FIELD

Embodiments of the invention relate to magnetic memory circuits, and in particular, to magnetic random access memory (MRAM) circuits.

BACKGROUND

Magnetic memory circuits are based on magneto-resistive behavior of magnetic storage elements that are integrated typically with a complementary metal-oxide-semiconductor (CMOS) technology. Such memory circuits generally provide non-volatility and an unlimited read and write capability. An example is the magnetic random access memory (MRAM) circuit that includes a plurality of memory cells, each defining an addressable magnetic storage element that may include a magnetic tunnel junction (MTJ) stack.

Each addressable MTJ stack can have a magnetic spin orientation and can be flipped between two states by the application of a magnetic field that is induced by energizing corresponding bit and word lines.

FIG. 1A illustrates a plan view of a section of an exemplary array 100 of memory cells X 112 in a magnetic random access memory (MRAM) circuit, that includes a set of longitudinal word lines (WL) 102 and a set of transverse bit lines (BL) 104. The set of BL 104 overlies the set of WL 102 to define crossover zones 108. An addressable MTJ stack 110 is disposed within each crossover zone 108. Current drivers 106 are provided for energizing the BL 104 and the WL 102. An address transistor (not shown) is provided under each MTJ stack 110 and in the memory cell X 112, for reading the state of the MTJ stack 110.

FIG. 1B illustrates a partly schematic and partly cross-sectional view of the memory cell X 112 in FIG. 1A. As shown in the cross-sectional view, the MTJ stack 110 is disposed within the crossover zone 108. The address transistor 132 is shown schematically. Generally, the MTJ stack 110 is designed to be integrated into a back-end metallization structure following a front-end CMOS processing. The MTJ stack 110 is shown to be provided between a first metallization layer Mx and a second metallization layer My, wherein the MTJ stack 110 is connected to the first layer Mx through a via hole 128 and to the second layer My through a via hole 116. The second layer My is patterned to include the BL 104. The MTJ stack 110 includes a free layer 118, a tunnel oxide layer 120, a fixed layer 122 and an extended bottom electrode 124. The first layer Mx is patterned to include the WL 102 for writing into the MTJ stack 110. The address transistor 132 is connected to the first layer Mx by a connection 130a. A read word line (WL) 130b in the first layer Mx is usable for selectively operating the address transistor 132. The WL 102 has no contact with the bottom electrode 124, and when energized, induces a magnetic field within the MTJ stack 110.

A write operation in a selected memory cell X 112 in the array 100 can be performed by energizing the corresponding BL 104 and the WL 102, to generate a magnetic field for changing the magnetic state of the corresponding MTJ stack 110. For a read operation, a voltage is applied to the BL 104 of the selected memory cell X 112, so that a current can flow through the corresponding MTJ stack 110 and the address transistor 132 that is selectively switched on by the WL 130b. The magnitude of the current sensed indicates the conductivity or the magnetic state of the MTJ stack 110.

SUMMARY OF THE INVENTION

According to an embodiment of a first aspect of the invention, an addressable memory cell is proposed, that comprises two conductors with a serially connected magnetic storage element and a Schottky diode between the two conductors. The Schottky diode provides a unidirectional conductive path between the two conductors and through the element. The diode is disposed according to one of the following two configurations:

(i) between the first conductor and the element in a first configuration, wherein the diode comprises a junction between a first metal layer and a first junction layer, wherein the first conductor comprises the first metal layer, and (ii) between the second conductor and the element in a second configuration, wherein the diode comprises a junction between a second metal layer and a second junction layer, wherein the second conductor comprises the second metal layer.

According to another embodiment of the first aspect of the invention, the first and second junction layers comprise titanium nitride (TiN).

According to another embodiment of the first aspect of the invention, the element is a magnetic tunnel junction (MTJ) stack.

According to another embodiment of the first aspect of the invention, the first conductor is a word line and the second conductor is a bit line.

According to another embodiment of the first aspect of the invention, the first metal layer and the second metal layer comprise aluminum.

According to another embodiment of the first aspect of the invention, the first conductor, the element, the diode and the second conductor are all vertically stacked on a substrate.

According to another embodiment of the first aspect of the invention, the second junction layer is atop the element in the second configuration.

According to an embodiment of a second aspect of the invention, a method of addressing a memory cell in a magnetic random access memory (MRAM) circuit is proposed, wherein the cell comprises a word line, a bit line and a magnetic tunnel junction (MTJ) stack between the two lines. The method is to provide a unidirectional conductive path between the two lines and through the MTJ stack by using a Schottky diode that is serially connected to the MTJ stack. The diode is disposed according to one of the aforesaid two configurations.

According to embodiments of the first and second aspects of the invention, the second junction layer is used as a hard mask for defining the element.

According to embodiments of the first and second aspects of the invention, the TiN in the first and second junction layers follow at least one of the following process conditions:
a) deposition at about (100) degrees centigrade, and
b) deposition at about (200 Angstrom) in thickness.

The embodiments of the invention are useful for achieving a higher density of integration by using the Schottky diode that replaces the address transistor that is generally used for a reading operation from the memory cell. The Schottky diode has higher speed of operation than that of a p-n junction diode. Advantageously, the junction layer can also be used as a hard mask for defining the magnetic storage element.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Broadly, embodiments of the invention disclose an addressable memory cell where the normally used address transistor for the read operation is replaced by a Schottky diode. Embodiments for methods of operation and processing the memory cell are also disclosed. The embodiments are particularly, though not exclusively, useful in forming an array in magnetic random access memory (MRAM) circuits. The magnetic storage element in the memory cell is for example, a magnetic tunnel junction (MTJ) stack. The diode being a uni-directional device, operates in a higher current regime for the selected memory cells and in a lower current regime for the unselected memory cells in the array. Advantageously, a high density memory array can be achieved with a sufficient current differential between the selected and unselected memory cells. The diode being a Schottky diode formed between a metal layer and a junction layer, has a higher speed of operation than that of a p-n junction diode. The junction layer can also be used as a hard mask for defining the magnetic storage element, which provides process simplicity and a higher accuracy of reproduction from a corresponding mask feature, than when defined with a resist masking layer. According to an embodiment, the junction layer is a non-semiconductor layer like TiN, which can be deposited at lower temperatures that can prevent thermal degradation of an already formed MTJ stack.

Figure 1A:
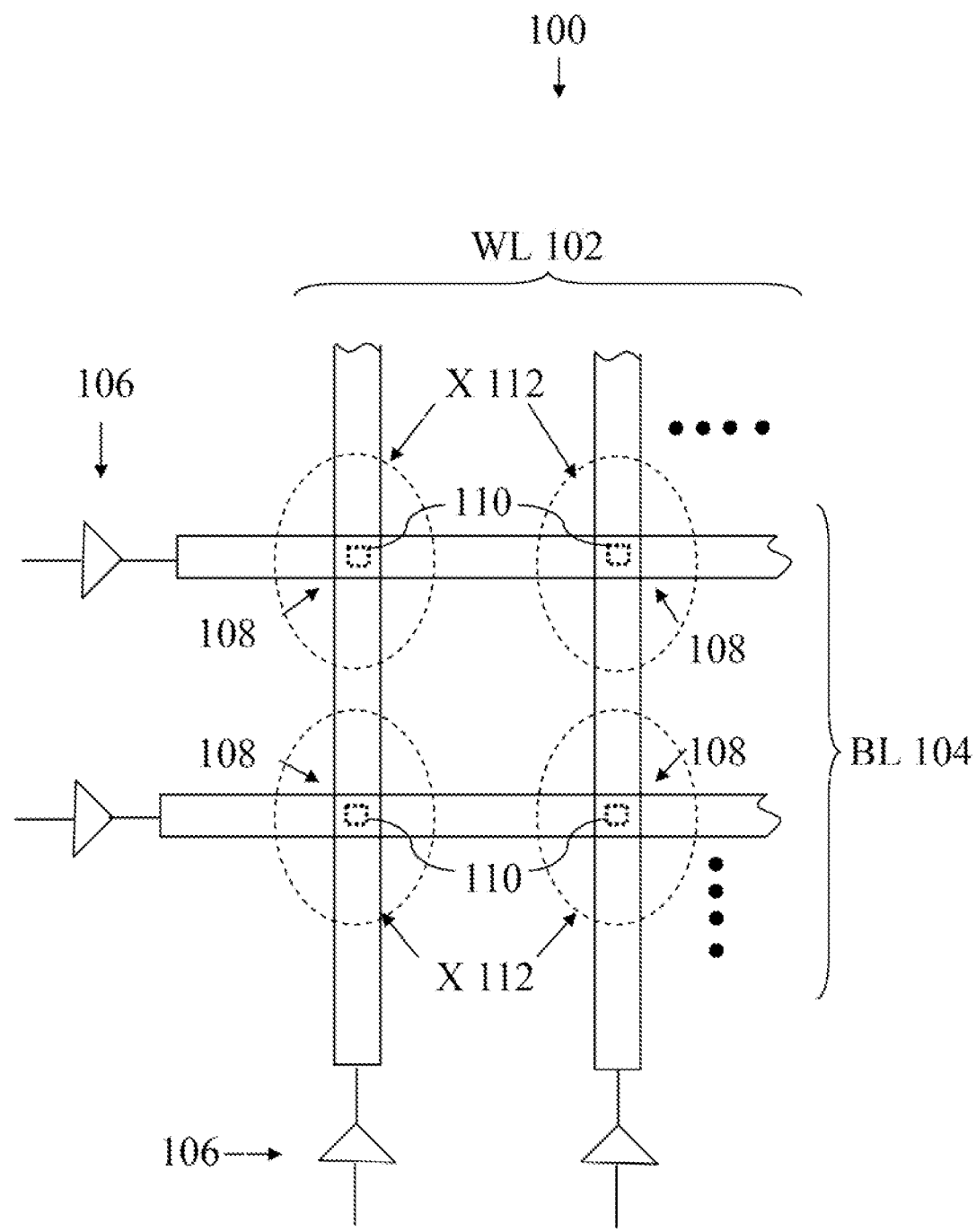
FIG. 1A illustrates a plan view of a section of an exemplary array of memory cells in a magnetic random access memory (MRAM) circuit.
Figure 1B:
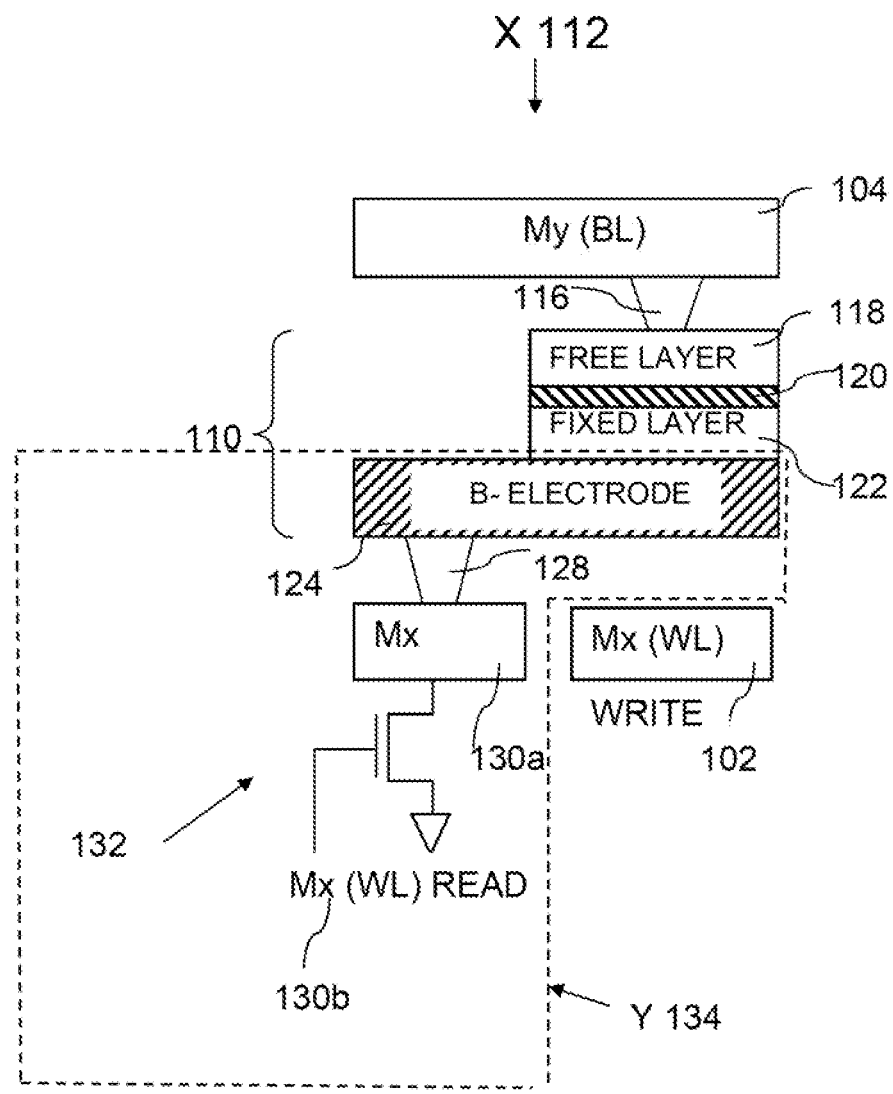
FIG. 1B illustrates a partly schematic and partly cross-sectional view of a memory cell described in FIG. 1A, with the memory cell including a magnetic tunnel junction (MTJ) stack.
Figure 2A:
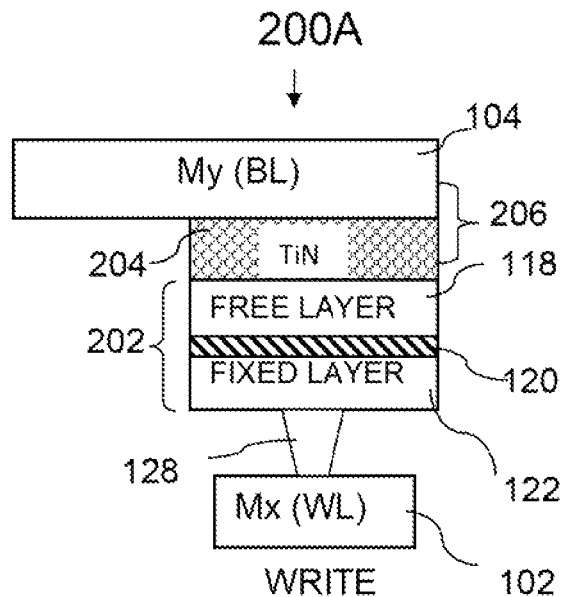
FIG. 2A illustrates the view at FIG. 1B, with the region marked Y therein being replaced by a Schottky diode that is serially connected to the MTJ stack, according to an embodiment of the invention.
Figure 2B:
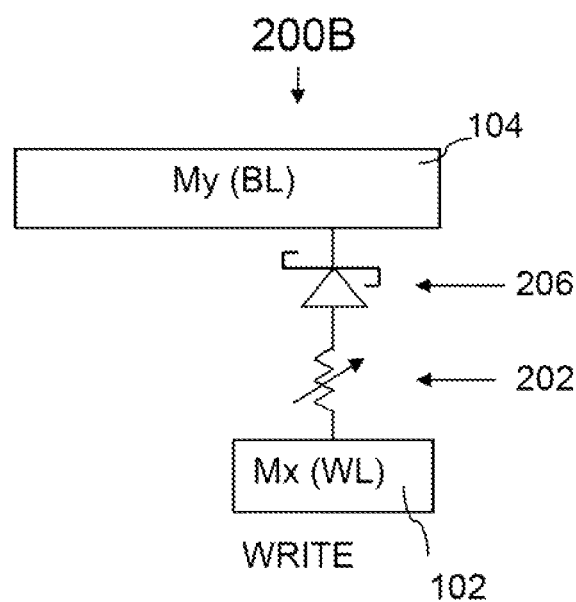
FIG. 2B is a fully schematic view of FIG. 2A, representing the MTJ stack with a variable resistor.

Referring now to FIG. 2A of the drawings, there is shown a view of a memory cell 200A, that is similar to FIG. 1B but with the region marked Y 134 therein being replaced by a Schottky diode 206 in series with the MTJ stack 202, according to an embodiment of the invention. Herein, the MTJ stack 202 is shown to have no extended bottom electrode 124 as in FIG. 1B, as it is redundant in this embodiment. The write WL 102 is in direct contact with the fixed layer 122, optionally through the first via hole 128. The Schottky diode 206 is formed between a junction layer 204 and a metal layer (not shown) in BL 104. FIG. 2B is a fully schematic view of FIG. 2A, representing the MTJ stack 202 as a variable resistor.

A write operation can be performed by energizing the BL 104 and the WL 102 to generate a magnetic field for changing the magnetic state of the MTJ stack 202. For a read operation, a voltage is applied to the BL 104, so that a current can flow through the Schottky diode 206 and the MTJ stack 202, to the WL 102. The magnitude of the current sensed indicates the conductivity and hence the magnetic state of the MTJ stack 202.

Figure 3A:
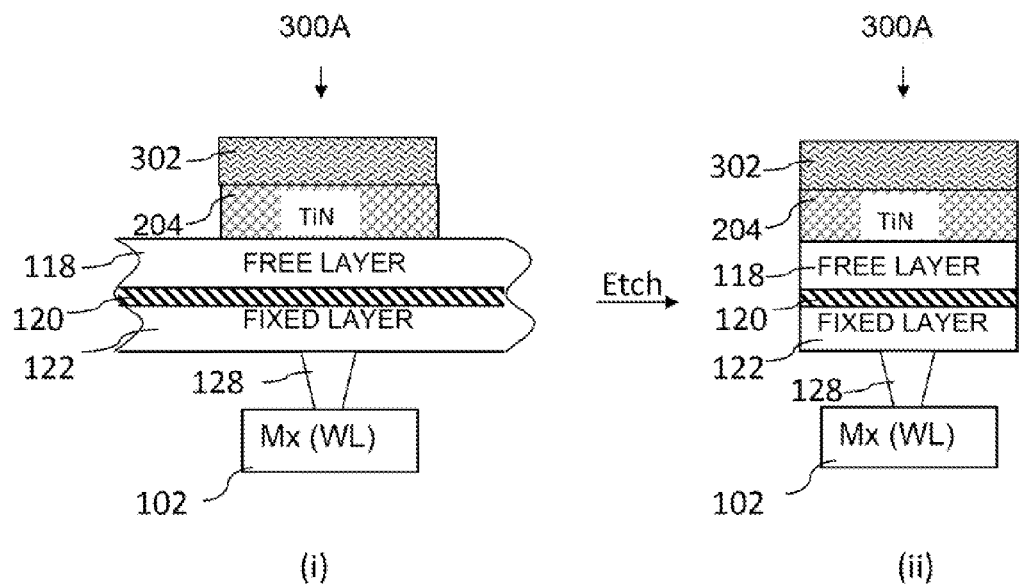
FIG. 3A illustrates an etch process for defining the MTJ stack, using a stack of a resist layer and the second junction layer as the masking layer.
Figure 3B:
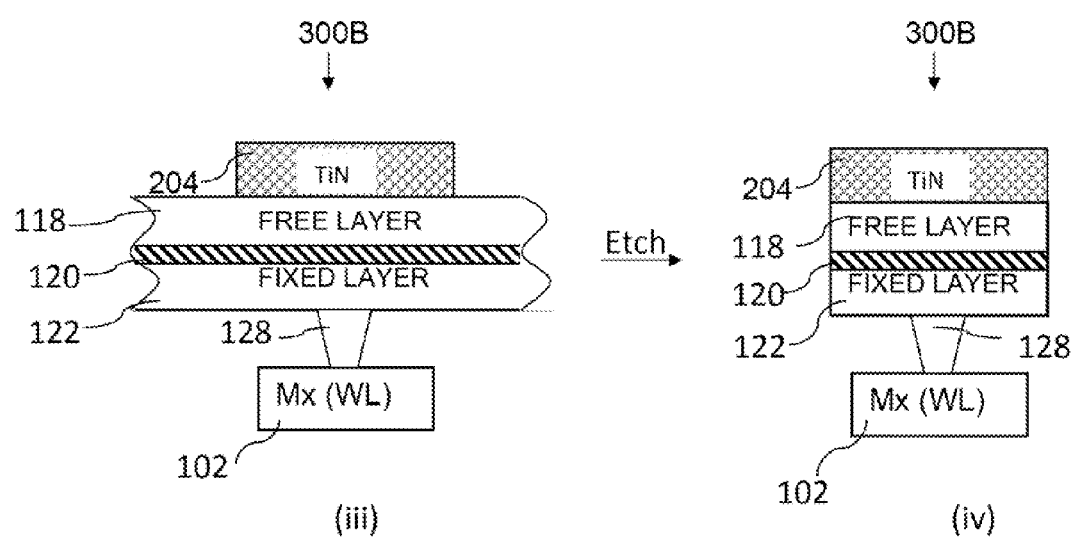
FIG. 3B illustrates an etch process for defining the MTJ stack, using the second junction layer as the masking layer.

Advantageously, the junction layer 204 can also be used as a hard mask for defining the MTJ stack 202 by etching. Use of hard masks in the field of fabrication of integrated circuits are known to reduce process complexity and provide better reproduction of the mask feature on the substrate. FIG. 3A illustrates an etch process for defining the MTJ stack 202, using another stack of a resist layer 302 and the junction layer 204 as the masking layer. As shown at step (i), the partially processed memory cell 300A has the resist layer 302 for defining the individual junction layer 204 in the memory cell 300A. As shown at step (ii), subsequently, the individual MTJ stack 202 for the partially processed memory cell 300A is also defined by etching, without requiring a separate lithographic step. FIG. 3B illustrates a similar process for defining the MTJ stack 202, using a masking layer of only the junction layer 204. As shown at step (iii), the partially processed memory cell 300B has the resist layer 302 stripped after defining the individual junction layer 204. As shown at step (iv), subsequently, the individual MTJ stack 202 for the partially processed memory cell 300B is defined by etching with only the junction layer 204 as the masking layer and without requiring a separate lithographic step.

In an alternate embodiment, the Schottky diode 206 can also be provided between the MTJ stack 202 and the WL 102, with suitable biasing conditions for operation. However, in this alternate embodiment, the advantage of using the junction layer 204 as the hard mask for defining the MTJ stack 202, is lost.

The drawings show the junction layer 204 as TiN. The embodiments of the invention may equally use other suitable materials for forming the Schottky diode 206. The process conditions for the TiN are likely to need optimization, for achieving the Schottky diode 206. According to an embodiment, the TiN has a thickness of about (200 Angstrom) and is deposited at a temperature of about (100 C). Other thicknesses and temperatures may equally be used with appropriate optimization. The embodiments of the invention may also use magnetic storage elements other than the MTJ stack 202. The metal layer in the BL 110 that forms the Schottky diode 206 with the junction layer 204, may be aluminum or any other suitable metal. With the embodiment described, the memory cell 200A is vertically stacked, which helps in denser integration and in easier processing. The vertical stacking also enables stacking multiple memory cells 200A vertically within different metallization layers, thereby enabling higher integration density. The memory cell 200A may be used in an array in a magnetic random access memory (MRAM) circuit. The MTJ stack 202 may have any kind of architecture and may use any combination of materials as necessary, to meet the required performance.

The embodiments of the invention are compatible with any semiconductor technology such as complementary metal-oxide-semiconductor (CMOS), bipolar-junction-transistor and CMOS (BiCMOS), silicon-on-insulator (SOI) and the like. The scope of the invention is also not limited to any particular technology in terms of processing sequence, materials, physical dimensions and the like.

The embodiments of the present invention may be applied to memory circuits for applications in any area, such as in automotive, mobile phone, smart card, radiation hardened military applications, database storage, Radio Frequency Identification Device (RFID), MRAM elements in field-programmable gate array (FPGA) and the like.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. An addressable memory cell comprising:
   a first conductor;
   a second conductor; and
   a serially connected magnetic storage element and a Schottky diode, between said two conductors,
   wherein said Schottky diode replaces an address transistor of a conventional memory cell to enable reading of said storage element without activating an address transistor associated with said cell and provides a unidirectional conductive path between said two conductors and through said element, said diode being disposed according to one of the following two configurations:
   (i) between said first conductor and said element in a first configuration, wherein said diode comprises a junction between a first metal layer and a first junction layer, wherein said first conductor comprises said first metal layer, and
   (ii) between said second conductor and said element in a second configuration, wherein said diode comprises a junction between a second metal layer and a second junction layer, wherein said second conductor comprises said second metal layer.

2. The memory cell of claim 1, wherein said first and second junction layers comprise titanium nitride (TiN).

3. The memory cell of claim 2 wherein said TiN in said first and second junction layers follow at least one of the following process conditions:
   a) deposition at about 100 degrees centigrade, and
   b) deposition at about 200 Angstrom in thickness.

4. A method of fabricating said memory cell of claim 2, said method comprising at least either of the following:
   a) depositing said TiN in said first and second junction layers at about 100 degrees centigrade, and
   b) depositing said TiN in said first and second junction layers at about 200 Angstrom in thickness.

5. The memory cell of claim 1, wherein said element is a magnetic tunnel junction (MTJ) stack.

6. The memory cell of claim 1, wherein said first conductor is a word line and said second conductor is a bit line.

7. The memory cell of claim 1, wherein said first metal layer and said second metal layer comprise aluminum.

8. The memory cell of claim 1 wherein said first conductor, said element, said diode and said second conductor are all vertically stacked on a substrate.

9. The memory cell of claim 8 wherein said second junction layer is atop said element in said second configuration.

10. The memory cell of claim 9 wherein said second junction layer is used as a hard mask for defining said element.

11. A method of fabricating said memory cell of claim 9, said method comprising:
    using said second junction layer as a hard mask for defining said element.

12. A magnetic random access memory (MRAM) circuit comprising an array of memory cells of claim 1.

13. A magnetic random access memory (MRAM) circuit comprising an array of addressable memory cells, wherein each said memory cell comprises:
    a word line;
    a bit line; and
    a serially connected magnetic tunnel junction (MTJ) stack and a Schottky diode, between said two lines,
    wherein said Schottky diode replaces an address transistor of a convention memory cell to enable reading said MTJ stack of a selected cell without activating an address transistor associated with said selected cell and provides a unidirectional conductive path between said two lines and through said element, said diode being disposed according to one of the following two configurations:
    (i) between said word line and said MTJ stack in a first configuration, wherein said diode comprises a junction between a first metal layer and a first junction layer, wherein said word line comprises said first metal layer, and
    (ii) between said bit line and said MTJ stack in a second configuration, wherein said diode comprises a junction between a second metal layer and a second junction layer, wherein said bit line comprises said second metal layer.

14. The MRAM circuit of claim 13, wherein said first and second junction layers comprise titanium nitride (TiN).

15. The MRAM circuit of claim 14, wherein said TiN in said first and second junction layers follow at least one of the following process conditions:
    a) deposition at about 100 degrees centigrade, and
    b) deposition at about 200 Angstrom in thickness.

16. The MRAM circuit of claim 13, wherein said first metal layer and said second metal layer comprise aluminum.

17. The MRAM circuit of claim 13 wherein said word line, said MTJ stack, said diode and said bit line are all vertically stacked on a substrate.

18. The MRAM circuit of claim 17 wherein said second junction layer is atop said MTJ stack in said second configuration.

19. The MRAM circuit of claim 18 wherein said second junction layer is used as a hard mask for defining said element.

20. A method of addressing a memory cell in a magnetic random access memory (MRAM) circuit, wherein said cell comprises a word line, a bit line and a magnetic tunnel junction (MTJ) stack between said two lines, said method comprising:
    applying a voltage to said bit line of said cell;
    providing a unidirectional conductive path between said two lines and through said MTJ stack by using a Schottky diode that is serially connected to said MTJ stack, said diode being disposed according to one of the following two configurations:
    (i) between said word line and said MTJ stack in a first configuration, wherein said diode comprises a junction between a first metal layer and a first junction layer, wherein said word line comprises said first metal layer, and
    (ii) between said bit line and said MTJ stack in a second configuration, wherein said diode comprises a junction between a second metal layer and a second junction layer, wherein said bit line comprises said second metal layer; and sensing a magnitude of a current flowing through said diode to said word line without activating an address transistor associated with said cell.

* * * * *